United States Patent
Kumar et al.

(10) Patent No.: US 10,196,881 B2
(45) Date of Patent: Feb. 5, 2019

(54) WELL SCREENS AND METHODS TO REDUCE SCREEN PLUGGING

(71) Applicants: Deepak Kumar, Houston, TX (US); Tarik Abdelfattah, Houston, TX (US); Adriana Hightower, Cypress, TX (US); Zhiyue Xu, Cypress, TX (US)

(72) Inventors: Deepak Kumar, Houston, TX (US); Tarik Abdelfattah, Houston, TX (US); Adriana Hightower, Cypress, TX (US); Zhiyue Xu, Cypress, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 0 days.

(21) Appl. No.: 15/410,921

(22) Filed: Jan. 20, 2017

(65) Prior Publication Data
US 2017/0211359 A1    Jul. 27, 2017

Related U.S. Application Data

(60) Provisional application No. 62/281,219, filed on Jan. 21, 2016.

(51) Int. Cl.
*E21B 43/08* (2006.01)
*C23C 16/26* (2006.01)

(52) U.S. Cl.
CPC ............ *E21B 43/08* (2013.01); *C23C 16/26* (2013.01); *E21B 43/084* (2013.01); *E21B 43/086* (2013.01); *E21B 43/088* (2013.01)

(58) Field of Classification Search
CPC ...... E21B 43/08; E21B 43/088; E21B 43/084; E21B 43/086
See application file for complete search history.

(56) References Cited

U.S. PATENT DOCUMENTS

| | | | | |
|---|---|---|---|---|
| 5,654,084 A | * | 8/1997 | Egert | B05D 1/60 428/215 |
| 6,402,636 B1 | * | 6/2002 | Chang | A63B 53/04 473/324 |
| 2003/0157336 A1 | | 8/2003 | Kinoshita et al. | |
| 2006/0110601 A1 | * | 5/2006 | Hennessey | B05D 5/083 428/422 |

(Continued)

OTHER PUBLICATIONS

Geddert, et al. "Extending the Induction Period of Crystallization Fouling Through Surface Coating", Heat Exchanger Fouling and Cleaning VII, vol. RP5, 2011; 8 pages.

(Continued)

*Primary Examiner* — Giovanna C. Wright
*Assistant Examiner* — Kristyn A Hall
(74) *Attorney, Agent, or Firm* — Cantor Colburn LLP

(57) ABSTRACT

A subterranean screen assembly comprises a base pipe with end connections to attach to a pipe string and a portion that is perforated or slotted; and a coated screen radially outwardly disposed of the base pipe. The coated screen comprises a screen substrate and a coating disposed on a surface of the screen substrate; the coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

16 Claims, 3 Drawing Sheets

(56) References Cited

U.S. PATENT DOCUMENTS

| | | | | |
|---|---|---|---|---|
| 2010/0233227 A1* | 9/2010 | Weber | .................. | A61F 2/91 |
| | | | | 424/422 |
| 2013/0277961 A1* | 10/2013 | Goto | .................. | C10M 169/041 |
| | | | | 285/94 |
| 2014/0024562 A1 | 1/2014 | Panga et al. | | |
| 2014/0158295 A1 | 6/2014 | Badrak | | |
| 2015/0132539 A1* | 5/2015 | Bailey | .................. | C23C 28/042 |
| | | | | 428/141 |

OTHER PUBLICATIONS

International Search Report, International Application No. PCT/US2016/067084, dated Mar. 24, 2017, Korean Intellectual Property Office; International Search Report 3 pages.

International Written Opinion, International Application No. PCT/US2016/067084, dated Mar. 24, 2017, Korean Intellectual Property Office; International Written Opinion 11 pages.

Zhao et al. "Effect of surface free energy on the adhesion of biofouling and cystalline fouling", Chemical Engineering Science 60 (2005) 4858-4865.

* cited by examiner

WELL SCREENS AND METHODS TO REDUCE SCREEN PLUGGING

CROSS-REFERENCE TO RELATED APPLICATIONS

The present application claims priority from U.S. Provisional Patent Application No. 62/281,219, filed Jan. 21, 2016. The contents of the priority application are hereby incorporated by reference in their entirety.

BACKGROUND

In many downhole fluid production wells, screens are used to remove solids from fluid entering the production string. Like many other articles used in a downhole environment, screens are often exposed to corrosive fluids, which may cause scales such as $CaCO_3$, $BaSO_4$, $CaSO_4$, $SrSO_4$ to build up on the surfaces of the screens. Organic materials such as asphaltenes may also precipitate. Once deposited, scales and asphaltenes can plug the screens thus blocking fluid flow and decreasing well production rates. Chemical and mechanical methods may be used to remove scales. Acids, chelators, or other chemicals may break or dissolve certain scales. Abrasive jets and mechanical tools have also been used to remove the scales. However, the techniques require costly well intervention, add up to non-productive time, and are sometimes not feasible. Accordingly, an alternative method of preventing scale or asphaltene-related fouling or lengthening screens uptime through scale and asphaltene minimization is continuously sought.

BRIEF DESCRIPTION

In an embodiment, a subterranean screen assembly comprises a base pipe with end connections to attach to a pipe string and a portion that is perforated or slotted; and a coated screen radially outwardly disposed of the base pipe; the coated screen comprising a screen substrate and a coating disposed on a surface of the screen substrate; the coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

In another embodiment, a method of making a screen for a subterranean environment comprises: disposing a coating on a screen substrate, the coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

In yet another embodiment, a method of using a subterranean screen assembly comprises: exposing the subterranean screen assembly as disclosed herein to a downhole fluid at an elevated temperature; the downhole fluid comprising calcium ions, magnesium ions, barium ions, strontium ions, iron ions, manganese ions, zinc ions, aluminum ions, cerium ions, asphaltenes or a combination comprising at least one of the foregoing, wherein the coated screen has less deposits than an uncoated but otherwise identical screen when exposed to the same fluid at the same elevated temperature.

The above described and other features are exemplified by the following Figures, Detailed Description, and Examples.

BRIEF DESCRIPTION OF THE DRAWINGS

Refer now to the drawings wherein like elements are numbered alike in the several Figures.

DETAILED DESCRIPTION

Figure 1:
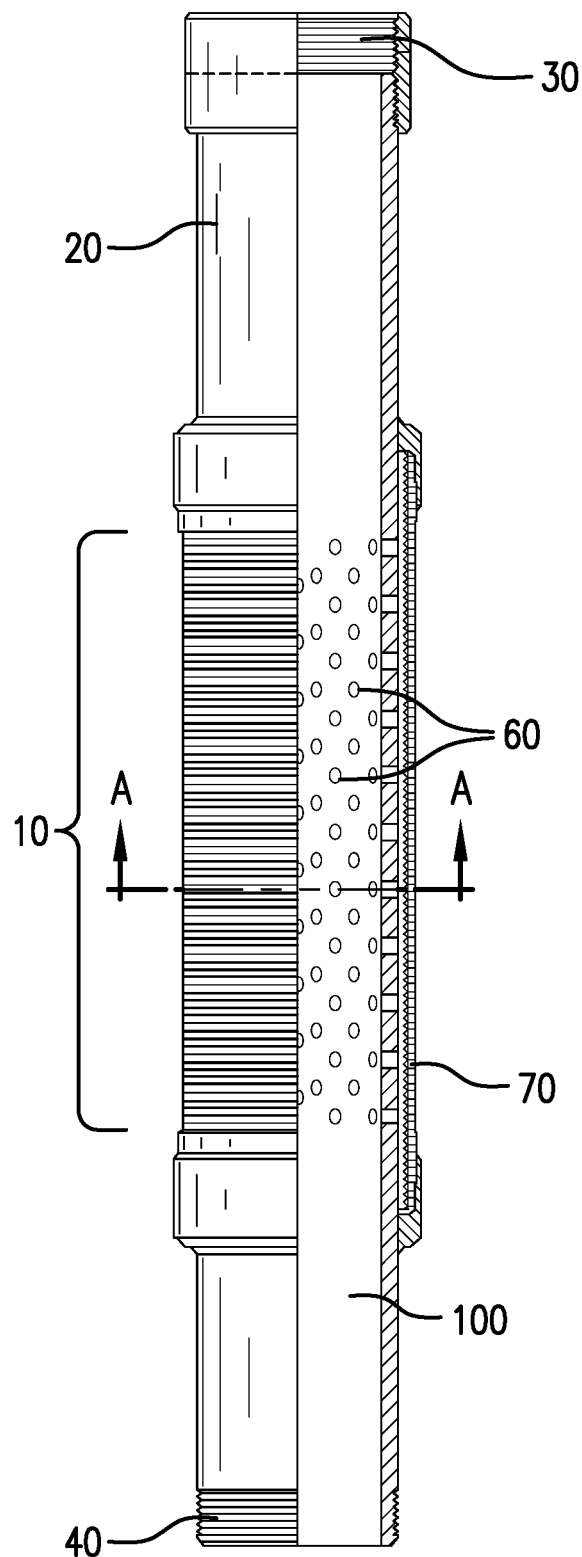
FIG. 1 illustrates a screen assembly used in a downhole application according to an embodiment of the disclosure.

Applicants have found that a coating comprising a fluoropolymer, a silicon, or an amorphous diamond like carbon doped with about 15 to 30 atomic percent of silicon and 10 to 20 atomic percent oxygen, or a combination comprising at least one of the foregoing dopants can significantly reduce the deposition of scales, asphaltenes, or a combination thereof on screens used in downhole environments as compared to an uncoated but otherwise identical screen used in the same environment. It has also been found the coated screens as described herein can maintain their integrity downhole even during stimulation or acidizing treatments at elevated temperatures.

The subterranean screen assembly comprises a base pipe with end connections to attach to a pipe string and a portion that is perforated or slotted; and a coated screen radially outwardly disposed of the base pipe.

The coated screen includes a screen substrate and a coating. As used herein, a screen substrate refers to a medium in which formation solids are filtered from produced fluid. The screen substrate is a slotted liner or a wire wrapped screen. The screen substrate can also be in a mesh form. The material for the screen substrate is not particularly limited and includes copper, nickel, chromium, iron, titanium, alloys thereof, or a combination comprising at least one of the foregoing. In an embodiment, the material for the screen substrate comprises steel, nickel-chromium based alloys such as INCONEL, and nickel-copper based alloys such as MONEL alloys. The steel can be a stainless steel containing about 10% to about 20% of chromium. The stainless steel can also contain about 8% to about 18% of nickel. Nickel-chromium based alloys contain about 40-75% of Ni and about 10-35% of Cr. The nickel-chromium based alloys can also contain about 1 to about 15% of iron. Small amounts of Mo, Nb, Co, Mn, Cu, Al, Ti, Si, C, S, P, B, or a combination comprising at least one of the foregoing can also be included in the nickel-chromium based alloys. Nickel-copper based alloys are primarily composed of nickel (up to about 67%) and copper. The nickel-copper based alloys can also contain small amounts of iron, manganese, carbon, and silicon. As used herein, the term "metal-based alloy" means a metal alloy wherein the weight percentage of the specified metal in the alloy is greater than the weight percentage of any other component of the alloy, based on the total weight of the alloy.

A coating can be disposed on a surface of the screen substrate after the screen substrate is formed. Alternatively, in the instance where the screen substrate is made of wires, the coated screen can be formed from coated wire. Methods of forming coated wires are the same as the methods of disposing a coating on a surface of preformed screen substrate.

The coating can include an amorphous diamond like carbon doped with about 10 to about 30 atomic percent of silicon, about 10 to about 20 atomic percent of oxygen, or a combination comprising at least one of the foregoing dopants. Optionally, the amorphous diamond like carbon further comprises 15 to 25 atomic percent of hydrogen atoms. Dopants such as "F" and "H" can also be included.

The amorphous diamond like carbon comprises 60 to 90 atomic percent of $sp^2$ bonded carbon and 10 to 40 atomic percent of $sp^3$ bonded carbon. As used herein, "$sp^2$ bonded carbon" refers to carbon atoms bonded to neighboring carbon atoms in a crystal structure substantially corresponding to the graphite isotope of carbon. "$Sp^3$ bonded carbon" refers to carbon atoms bonded to neighboring carbon atoms in a crystal structure substantially corresponding to the diamond isotope of carbon.

The dopants can be uniformly distributed in the coating or be present in a gradient. For example, an atomic concentration of Si, O, F, or a combination comprising at least one of the foregoing in the coating can decrease in a direction towards the surface.

Depending on the composition of the substrate, a layer of silicon, chromium, titanium, zirconium or their alloys with thickness not exceeding 0.5 microns may be used between the screen substrate and the doped-diamond like carbon coating to facilitate better adhesion between the screen substrate and coating.

The doped amorphous diamond like carbon can be deposited on a surface of a substrate by vapor deposition. A "vapor deposition" process refers to a process of depositing materials on a substrate through the vapor phase. Vapor deposition processes include physical vapor deposition, chemical vapor deposition, and plasma-assisted vapor deposition. Different variations of physical deposition, chemical deposition, and plasma-assisted vapor deposition can be used. Exemplary deposition processes can include plasma assisted chemical vapor deposition, sputtering, ion beam deposition, laser ablation, or thermal evaporation. In an embodiment, the doped amorphous diamond like carbon is deposited by plasma ion immersion implantation and deposition.

The gaseous medium for the vapor deposition can be 100% hexamethyldisiloxane or a mixture of tetramethylsilane and $C_2H_2$ gases for Si or a combination of Si and O doped amorphous diamond like carbon. For fluorine doped amorphous diamond like carbon, the gaseous medium is a mixture of $C_2H_2$ and $C_2F_4$ gases.

In addition to doped amorphous diamond like carbon, a polymer can also be coated on a surface of the screen substrate. The polymer includes a fluoropolymer, a silicone, or combinations comprising at least one of the foregoing. Fluoropolymers are materials containing multiple carbon-fluorine bonds. Examples of fluoropolymers include polytetrafluoroethylene, fluorinated ethylene propylene, perfluoroalkoxy, and polyvinylidene fluoride. The silicone can be polydimethylsiloxane.

The polymer can be applied to the surface of the screen substrate by any method known in the art, for example, by spray coating, dip-coating, thermal evaporation coating, or other coating techniques. In an embodiment, the coating is formed by dispersing the fluoropolymer in a binder to form a dispersed fluoropolymer; spraying the dispersed fluoropolymer on the surface of the screen; and curing the dispersed fluoropolymer at a temperature of up to about 800° F. In a specific embodiment, the curing is conducted at about 600° F. to about 800° F. for about 15 minutes to about 3 hours at atmospheric pressure. Exemplary binder includes phenolic resin, phenoxy resin, epoxy resin, epoxy-phenolic resin, amine epoxy, or a combination comprising at least one of the foregoing.

The thickness of the coating varies depending on the gauge of the screen (opening gap between the screen and the base pipe) as well as the materials used for the coating. When the coating comprises the doped amorphous diamond like carbon, it has a thickness of about 0.5 microns to about 5 microns or about 0.5 to about 3 microns. When the coating comprises a polymer as described herein, the coating has a thickness of about a thickness of about 5 microns to about 20 microns.

Figure 2:
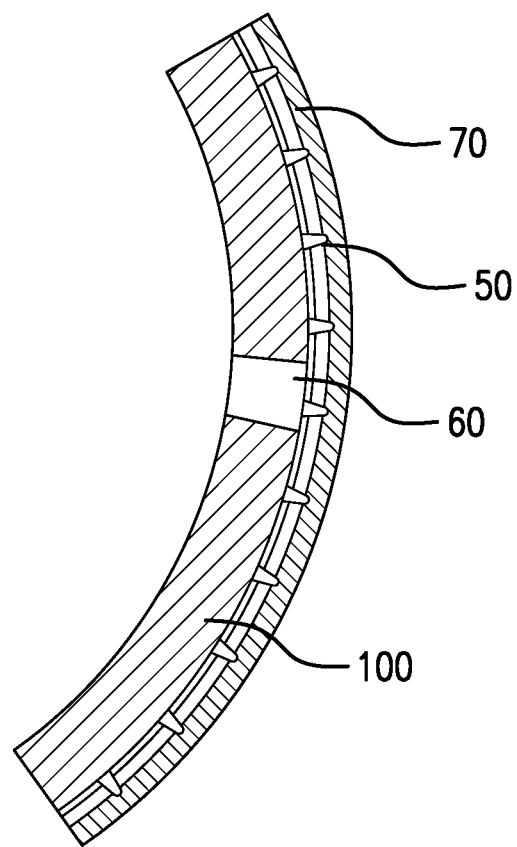
FIG. 2 is cross-sectional view of the screen in FIG. 1 along line A-A.

An exemplary embodiment of the screen assembly is illustrated in FIG. 1. A cross-sectional view of the screen along A-A line is illustrated in FIG. 2. As shown in these figures, a screen assembly includes a base pipe 20 having two threaded ends 30 and 40, which can be used to attach the base pipe to a production pipe string (not shown). The base pipe 20 comprises a perforated portion having a plurality of openings 60 on pipe wall 100. The size and shape of the openings are not limited and can be selected to provide a substantial area for flow of produced fluids and to maintain the structural integrity of the pipe. The screen assembly also includes a coated screen 10 surrounding the perforated portion of the base pipe. The coated screen shown in FIG. 1 is a wire based screen that includes a plurality of spaced rib wires 50, around which wire 70 is wrapped in spaced coils. The wrapping wire 70 can be welded to the rib wires 50.

The screen assembly can include one or more flow wetted parts in addition to the screen and the base pipe. As used herein, a flow wetted part refers to a part that comes in direct contact with a fluid during the operation of the screen assembly. The additional flow wetted parts include, but are not limited to a flow regulator such as an inflow control device, an outflow control device, or a combination thereof, a housing, or connection rings. In an embodiment, at least one of the base pipe and the additional flow wetted parts are coated with a coating as described herein for the screen substrate.

Figure 3:
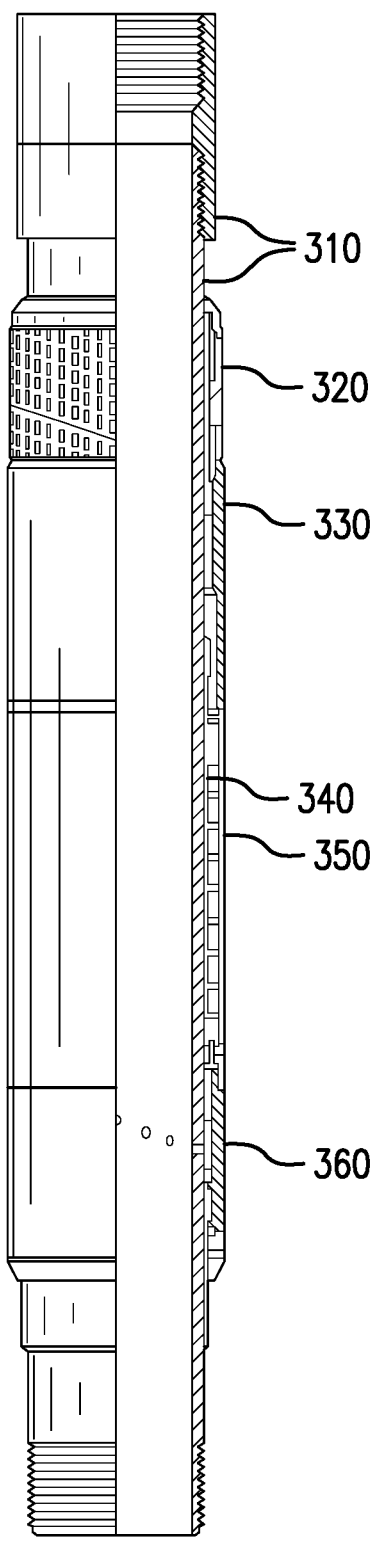
FIG. 3 illustrates a screen assembly according to another embodiment of the disclosure.

FIG. 3 shows an exemplary screen assembly according to another embodiment of the disclosure. The screen assembly comprises base pipe 310, screen 320, connection ring 330, flow regulator 340, flow regulator housing 350, and connection ring 360. In addition to screen 320, one or more of base pipe 310, flow regulator 340, flow regulator housing 350, and connection rings 330 and 360 can be coated with a coating as disclosed herein.

The coated screen has reduced deposits when used in a downhole environment as compared to an uncoated screen. A method of using the screen comprises exposing the screen assembly as disclosed herein to a downhole fluid at an elevated temperature. The downhole fluid can include calcium ions, magnesium ions, barium ions, strontium ions, iron ions, manganese ions, zinc ions, aluminum ions, cerium ions, asphaltenes or a combination comprising at least one of the foregoing ions. In a specific embodiment, the downhole fluid contains magnesium ions, calcium ions, asphaltenes, or a combination thereof. The elevated temperature can be up to about 670° F., for example about 100° F. to 650° F.

Further included in this disclosure are the following specific embodiments, which do not necessarily limit the claims.

Embodiment 1. A subterranean screen assembly comprising: a base pipe with end connections to attach to a pipe string and a portion that is perforated or slotted; and a coated screen radially outwardly disposed of the base pipe; the coated screen comprising a screen substrate and a coating disposed on a surface of the screen substrate; the coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

Embodiment 2. The subterranean screen assembly of Embodiment 1, wherein the coating comprises a fluoropolymer and has a thickness of about 5 microns to about 20 microns.

Embodiment 3. The subterranean screen assembly of Embodiment 1 or Embodiment 2, wherein the coating comprises the diamond like carbon and has a thickness of about 0.5 micron to about 5 microns.

Embodiment 4. The subterranean screen assembly of Embodiment 3, wherein the diamond like carbon comprises 60 to 90 atomic percent of $sp^2$ bonded carbon and 10 to 40 atomic percent of $sp^3$ bonded carbon.

Embodiment 5. The subterranean screen assembly of any one of Embodiments 1 to 4, wherein the screen substrate comprises copper, nickel, chromium, iron, titanium, alloys thereof, or a combination comprising at least one of the foregoing.

Embodiment 6. The subterranean screen assembly of any one of Embodiments 1 to 5, wherein the screen substrate is a slotted liner, a wire wrapped screen, or a screen mesh.

Embodiment 7. The subterranean screen assembly of any one of Embodiments 1 to 6, wherein the base pipe is coated with a coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

Embodiment 8. The subterranean screen assembly of any one of Embodiments 1 to 7 further comprising a flow wetted part, the flow wetted part being coated with a coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

Embodiment 9. The subterranean screen assembly of claim 8, wherein the flow wetted part comprises a flow regulator coupled to the base pipe, a housing for the flow regulator, a connection ring, or a combination comprising at least one of the foregoing.

Embodiment 10. A method of making a screen for a subterranean environment, the method comprising: disposing a coating on a screen substrate, the coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing.

Embodiment 11. The method of Embodiment 10, wherein the coating comprises a fluoropolymer and has a thickness of about 5 microns to about 20 microns.

Embodiment 12. The method of Embodiment 11, wherein the disposing comprises: dispersing the fluoropolymer in a binder to form a dispersed fluoropolymer; spraying the dispersed fluoropolymer on the surface of the screen substrate; and curing the dispersed fluoropolymer at a temperature of up to about 800° F. to provide the coated screen.

Embodiment 13. The method of Embodiment 11 or Embodiment 12, wherein the curing is conducted at about 600° F. to about 800° F. for about 15 minutes to about 3 hours.

Embodiment 14. The method of Embodiment 12 or Embodiment 10, wherein the binder comprises phenolic resin, phenoxy resin, epoxy resin, epoxy-phenolic resin, amine epoxy, or a combination comprising at least one of the foregoing.

Embodiment 15. The method of any one of Embodiments 11 to 14, wherein the fluoropolymer comprises polytetrafluoroethylene, fluorinated ethylene propylene, perfluoroalkoxy, polyvinylidene fluoride, or a combination comprising at least one of the foregoing.

Embodiment 16. The method of any one of Embodiments 11 to 15, wherein the fluoropolymer comprises polytetrafluoroethylene, fluorinated ethylene propylene, or a combination thereof; and the binder comprises a phenolic resin, an amine epoxy, or a combination thereof.

Embodiment 17. The method of Embodiment 10, wherein the coating comprises the diamond like carbon and has a thickness of about 0.5 micron to about 5 microns.

Embodiment 18. The method of Embodiment 17, wherein disposing comprises depositing the doped diamond like carbon on a surface of the screen substrate via physical vapor deposition, chemical vapor deposition, or plasma-assisted vapor deposition.

Embodiment 19. The method of Embodiment 17 or Embodiment 18, wherein the depositing comprises plasma ion immersion implantation and deposition.

Embodiment 20. The method of any one of Embodiments 17 to 19, wherein the diamond like carbon comprises 60 to 90 atomic percent of $sp^2$ bonded carbon and 10 to 40 atomic percent of $sp^3$ bonded carbon.

Embodiment 21. The method of any one of Embodiments 10 to 20, wherein the screen substrate comprises copper, nickel, chromium, iron, titanium, alloys thereof, or a combination comprising at least one of the foregoing.

Embodiment 22. A method of using a subterranean screen assembly, the method comprising: exposing the subterranean screen assembly of any ne of Embodiments 1 to 9 to a downhole fluid at an elevated temperature; the downhole fluid comprising calcium ions, magnesium ions, barium ions, strontium ions, iron ions, manganese ions, zinc ions, aluminum ions, cerium ions, asphaltenes or a combination comprising at least one of the foregoing, wherein the coated screen has less deposits than an uncoated but otherwise identical screen when exposed to the same fluid at the same elevated temperature.

Embodiment 23. The method of Embodiment 22, wherein the elevated temperature is about 100° F. to 650° F.

All ranges disclosed herein are inclusive of the endpoints, and the endpoints are independently combinable with each other. As used herein, "combination" is inclusive of blends, mixtures, alloys, reaction products, and the like. All references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." The modifier "about" used in connection with a quantity is inclusive of the stated value and has the meaning dictated by the context (e.g., it includes the degree of error associated with measurement of the particular quantity).

While typical embodiments have been set forth for the purpose of illustration, the foregoing descriptions should not be deemed to be a limitation on the scope herein. Accordingly, various modifications, adaptations, and alternatives can occur to one skilled in the art without departing from the spirit and scope herein.

What is claimed is:

1. A subterranean screen assembly comprising:
   a base pipe with end connections to attach to a pipe string and a portion that is perforated or slotted; and
   a coated screen radially outwardly disposed of the base pipe; the coated screen comprising a screen substrate and a coating disposed on a surface of the screen substrate;
   the coating comprising an amorphous diamond like carbon doped with about 10 to about 30 atomic percent of silicon and about 10 to about 20 atomic percent of oxygen.

2. The subterranean screen assembly of claim 1, wherein the coating comprises the diamond like carbon and has a thickness of about 0.5 micron to about 5 microns.

3. The subterranean screen assembly of claim 2, wherein the diamond like carbon comprises 60 to 90 atomic percent of $sp^2$ bonded carbon and 10 to 40 atomic percent of $sp^3$ bonded carbon.

4. The subterranean screen assembly of claim 1, wherein the screen substrate is a slotted liner, a wire wrapped screen, or a screen mesh.

5. The subterranean screen assembly of claim 1, wherein the base pipe is coated with a coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing polymer.

6. The subterranean screen assembly of claim 1 further comprising a flow wetted part, the flow wetted part being coated with a coating comprising an amorphous diamond like carbon doped with about 10 to about 30 atomic percent of silicon, about 10 to about 20 atomic percent of oxygen, or a combination comprising at least one of the foregoing dopants, or a polymer comprising a fluoropolymer, a silicone, or a combination comprising at least one of the foregoing polymer.

7. The subterranean screen assembly of claim 6, wherein the flow wetted part comprises a flow regulator coupled to the base pipe, a housing for the flow regulator, a connection ring, or a combination comprising at least one of the foregoing.

8. A subterranean screen assembly comprising:
   a base pipe with end connections to attach to a pipe string and a portion that is perforated or slotted; and
   a coated screen radially outwardly disposed of the base pipe; the coated screen comprising a screen substrate and a coating disposed on a surface of the screen substrate;
   the coating comprising an amorphous diamond like carbon doped with about 10 to about 30 atomic percent of silicon and about 10 to about 20 atomic percent of oxygen, or a polymer comprising a silicone,
   wherein the screen substrate comprises copper, nickel, chromium, iron, titanium, alloys thereof, or a combination comprising at least one of the foregoing.

9. A method of making a screen for a subterranean environment, the method comprising:
   disposing a coating on a screen substrate, the coating comprising an amorphous diamond like carbon doped with about 10 to about 30 atomic percent of silicon and about 10 to about 20 atomic percent of oxygen.

10. The method of claim 9, wherein the coating comprises the diamond like carbon and has a thickness of about 0.5 micron to about 5 microns.

11. The method of claim 10, wherein disposing comprises depositing the doped diamond like carbon on a surface of the screen substrate via physical vapor deposition, chemical vapor deposition, or plasma-assisted vapor deposition.

12. The method of claim 11, wherein the depositing comprises plasma ion immersion implantation and deposition.

13. The method of claim 11, wherein the diamond like carbon comprises 60 to 90 atomic percent of $sp^2$ bonded carbon and 10 to 40 atomic percent of $sp^3$ bonded carbon.

14. The method of claim 9, wherein the screen substrate comprises copper, nickel, chromium, iron, titanium, alloys thereof, or a combination comprising at least one of the foregoing.

15. A method of using a subterranean screen assembly, the method comprising:
   exposing the subterranean screen assembly of claim 1 to a downhole fluid at an elevated temperature;
   the downhole fluid comprising calcium ions, magnesium ions, barium ions, strontium ions, iron ions, manganese ions, zinc ions, aluminum ions, cerium ions, asphaltenes or a combination comprising at least one of the foregoing,
   wherein the coated screen has less deposits than an uncoated but otherwise identical screen when exposed to the same fluid at the same elevated temperature.

16. The method of claim 15, wherein the elevated temperature is about 100° F. to 650° F.

* * * * *